United States Patent [19]

Haku et al.

[11] Patent Number: 4,719,123
[45] Date of Patent: Jan. 12, 1988

[54] METHOD FOR FABRICATING PERIODICALLY MULTILAYERED FILM

[75] Inventors: Hisao Haku, Neyagawa; Yukio Nakashima, Hirakata; Kaneo Watanabe, Yawata; Tsugufumi Matsuoka, Neyagawa, all of Japan

[73] Assignee: Sanyo Electric Co., Ltd., Moriguichi, Japan

[21] Appl. No.: 891,758

[22] Filed: Jul. 31, 1986

[30] Foreign Application Priority Data

Aug. 5, 1985 [JP] Japan ............... 60-172570
Sep. 27, 1985 [JP] Japan ............... 60-215261

[51] Int. Cl.⁴ .............................................. B05D 3/06
[52] U.S. Cl. ....................................... 437/101; 427/86; 427/75; 427/74; 427/87; 427/85; 427/88; 427/89; 427/91; 427/93; 427/53.1; 437/173; 437/235
[58] Field of Search ................. 427/86, 75, 74, 87, 427/85, 88, 89, 91, 93, 53.1

[56] References Cited

U.S. PATENT DOCUMENTS

| | | | |
|---|---|---|---|
| 4,237,151 | 12/1980 | Strongin | 427/74 |
| 4,435,445 | 3/1984 | Allred | 427/86 |
| 4,461,783 | 7/1984 | Yamazaki | 427/86 |
| 4,492,605 | 1/1985 | Ishihara | 427/86 |
| 4,505,950 | 3/1985 | Yamazaki | 427/86 |
| 4,564,533 | 1/1986 | Yamazaki | 427/54.1 |
| 4,588,610 | 5/1986 | Yamazaki | 427/54.1 |

FOREIGN PATENT DOCUMENTS 60-41215 3/1985 Japan.

OTHER PUBLICATIONS

B. A. Scott et al., "Deposition of a-Si:H by Homogeneous CVD," Journal De Physique Colloque C4, Supplement au N°10, Tome 42, Oct. 1981, C4-635 to C4-638.
Murase, K. et al. "Silicon-Germanium-Boron Ternary Amorphous Alloy" Japanese Journal of Applied Physics, vol. 21, No. 4, Apr., 1982, pp. 561-566.
Extended Abstracts of the 30th Spring Meeting of the Japan Society of Applied Physics and Related Societies, 6P-B-17, 1983, p. 377.

*Primary Examiner*—Sam Silverberg
*Assistant Examiner*—Vi Duong Dang
*Attorney, Agent, or Firm*—W. G. Fasse; D. H. Kane, Jr.

[57] ABSTRACT

A method for fabricating a periodically multilayered film having a plurality of amorphous thin layers of different kinds stacked periodically is performed by forming at least one kind of the layers in the stack by a photo CVD method, whereby a more definite periodicity in the composition of the lattice and fewer defects are achieved.

12 Claims, 8 Drawing Figures

METHOD FOR FABRICATING PERIODICALLY MULTILAYERED FILM

FIELD OF THE INVENTION

The present invention relates to a method for fabricating a periodically multilayered film with periodically stacked amorphous layers, and more particularly to a method for fabricating a periodically multilayered film having a more definite periodicity and fewer defects.

DESCRIPTION OF THE PRIOR ART

Generally, a periodically multilayered film with periodically stacked semiconductor layers of more than two kinds having different energy band gaps and/or conductivity types is referred to as a superlattice device, in which carriers can move at high speed due to the quantum well effect. In the case where such a superlattice device is formed of crystalline semiconductor layers, there arises the problem that the device has a short operational life due to the lattice mismatch caused by different crystal structures and/or lattice parameters between the semiconductor layers of different kinds.

On the other hand, in the case where the superlattice device is formed of amorphous semiconductor layers, the above described problem due to the lattice mismatch between different kinds of semiconductor layers is reduced, since the amorphous semiconductor permits a larger freedom in construction.

A plasma CVD (chemical vapor deposition) method for fabricating a superlattice device with amorphous semiconductor layers is disclosed in U.S. Patent Application Ser. No. 474,442 now abandoned. According to this method, a source gas material is introduced in a reaction chamber, and a first thin semiconductor layer is formed on a substrate by causing a plasma CVD from a glow discharge. Then, the source gas in the reaction chamber is replaced by another source gas, and a second thin semiconductor layer is formed on the first thin semiconductor layer again by a CVD glow discharge. Periodically repeating these steps, a superlattice device is formed with stacked layers in which all the layers are formed by a CVD glow discharge.

However, in plasma CVD, a high energy charged particle may damage the film. Specifically, if the film is damaged by plasma at the interface between different kinds of semiconductor layers, mixing or interdiffusion of impurities occurs between the layers resulting in an indefinite periodicity.

SUMMARY OF THE INVENTION

A principle object of the present invention is to provide a method for fabricating a periodically multilayered film having a definite periodicity and fewer defects.

According to the present invention, a method for fabricating a periodically multilayered film with a plurality of amorphous layers stacked periodically to form a stack, comprises the step of forming at least one kind of the layers in the stack by photo CVD.

Other objects, features and advantages of the present invention will be more apparent from the following description of a preferred embodiment when taken in conjunction with the accompanying drawings.

DESCRIPTION OF PREFERRED EMBODIMENTS AND OF THE BEST MODE OF THE INVENTION

Figure 1:
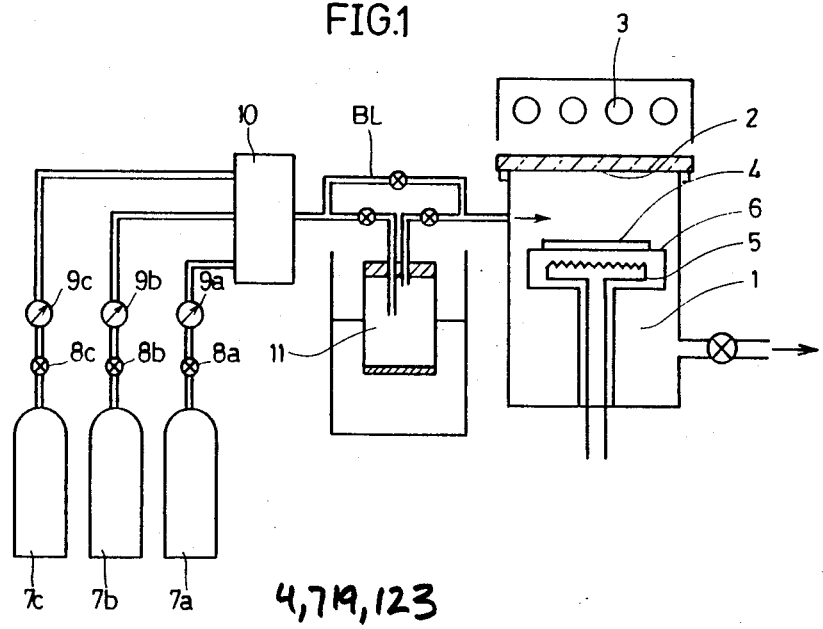
FIG. 1 is a conceptional view of a photo CVD device used for performing the method according to the present invention.

FIG. 1 is a conceptional view of a photo CVD device for illustrating the performance of a method according to an embodiment of the present invention. A ceiling 2 of a reaction chamber 1 is made of a transparent quartz plate. A light source 3 comprising low pressure mercury lamps radiating ultraviolet light with a wavelengths of 1849 Å and 2537 Å is provided above the quartz plate 2, whereby the ultraviolet light passes through the quartz plate 2 into the reaction chamber 1. A substrate 4 is positioned in the reaction chamber 1 on a susceptor 6 which contains a heater 5 before starting the operation. The substrate 4 must be suited for supporting a thin film having a thickness of about less than a micron to several microns. The substrate may be made of a glass, ceramic or metal plate as desired. A metal film or a transparent conductive film such as $SnO_2$ or ITO provided on a glass or ceramic plate may also be employed as the substrate 4.

Source gases for the photo CVD are supplied from gas cylinders 7a, 7b, 7c through valves 8a, 8b, 8c and mass flow controllers 9a, 9b, 9c to a gas selector 10. The source gas periodically selected by the gas selector 10 is introduced into the reaction chamber 1 with mercury vapor serving as a sensitizer through a mercury reservoir 11 held at a prescribed temperature within the range from room temperature to 80° C.

A method utilizing mercury vapor is well known as a mercury sensitizing method. The mercury vapor is used for decomposing molecules which do not absorb the ultraviolet or which have a low absorption efficiency. Namely, the reaction gas is decomposed not directly by the ultraviolet but by collision of mercury atoms excited by the ultraviolet with molecules of the reaction gas. In the case where mercury sensitizing is not required, the reaction gas is introduced into the reaction chamber 1 through a bypass line BL.

Figure 2:
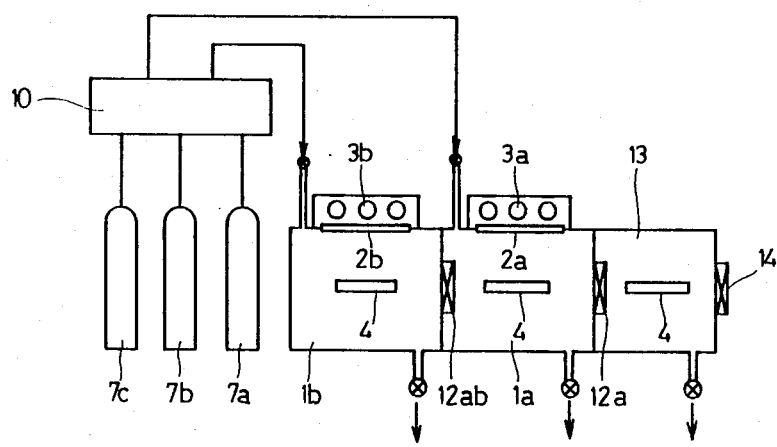
FIG. 2 is a conceptional view of another photo CVD device used for performing the method according to the present invention.

FIG. 2 is a conceptional view of a photo CVD device for illustrating a method according to another embodiment of the present invntion. In this photo CVD device, first and second reaction chambers 1a and 1b are provided. The substrate 4 is supported by a moving means (not shown) for moving the substrate from one of the two reaction chambers 1a and 1b to the other reaction chamber through an openable separation shutter 12ab.

A preparatory chamber 13 is provided adjacent to the first reaction chamber 1a for introducing the substrate 4 to be processed into the reaction chamber 1a and for taking out the processed substrate 4 therefrom. The preparatory chamber 13 is separated from the reaction chamber 1a by an openable separation shutter 12a and is also provided with another shutter 14 for introducing the substrate 4 from the outside into the chamber 13 and for taking it out again.

The gas supply system for introducing source gas into the reaction chambers 1a and 1b is similar to that of the device shown in FIG. 1 and it is shown in a simplified manner.

Figure 3A:
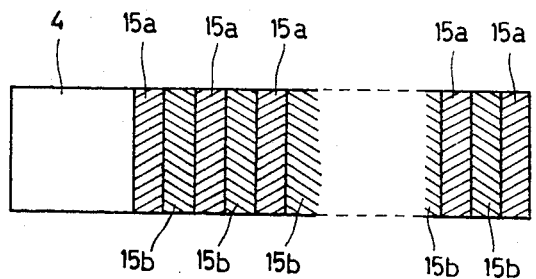
FIG. 3A is a cross sectional view schematically showing the structure of a periodically multilayered film.

FIG. 3A is a schematic cross sectional view showing the structure of a periodically multilayered film which is fabricated according to the present invention and operates as a superlattice device. Amorphous thin layers 15a and 15b of less than about 50 Å thickness each are stacked alternately on a main surface of the substrate 4. These amorphous thin layers 15a and 15b include at least one element selected from the elements in group IVa of the periodic table and they have band gaps and/or conductivity types different from each other.

More specifically, the following substances may be used for an amorphous thin layer having a wider band gap; silicon (a-Si: where "a" represents the term amorphous which has a wide meaning including a microcrystalline substance), silicon carbide (a-Si$_{1-x}$C$_x$: x=0–0.8, $E_{opt}$=1.7–2.8 eV), silicon nitride (a-Si$_{1-x}$N$_x$: x=0–0.4, $E_{opt}$=1.7–3.5 eV), silicon oxide (a-Si$_{1-x}$O$_x$: x=0–0.5, $E_{opt}$=1.7–3.0 eV) and carbon (a-C).

The following substances may be used for an amorphous thin layer having a smaller band gap; a-Si (including a little hydrogen and/or microcrystallites), silicon germanium (a-Si$_{1-x}$Ge$_x$: x=0–1, $E_{opt}$=0.7–1.7 eV) and silicon tin (a-Si$_{1-x}$Sn$_x$: x=0–1, $E_{opt}$=0.7–1.7 eV).

As is known, the band gap changes depending upon conditions of fabrication, and in an alloyed semiconductor it changes depending upon the composition. Therefore, the band gap is not always the same even if the material is of the same system. Further, the widths of the band gap are compared relatively between amorphous thin layers of more than two kinds forming the periodically multilayered film, so that the combination of materials is not limited to the above examples.

An arbitrary combination of conductivity types of p-type, i-type and n-type may be applied for the periodic change of the amorphous thin layers according to circumstances.

Figure 3B:
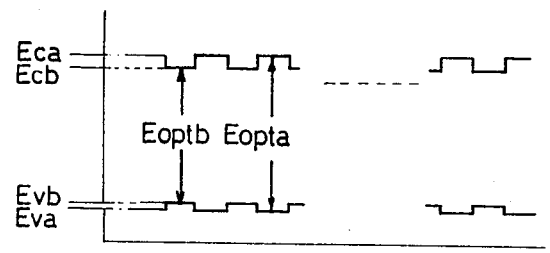
FIG. 3B is an energy band gap profile corresponding to the periodic structure of FIG. 3A.

FIG. 3B shows an energy band gap profile corresponding to the cross sectional structure of a periodically multilayered film of FIG. 3A which is composed of amorphous thin layers 15a of p-type hydrogenated a-SiC (hereinafter referred to as a-SiC:H) and amorphous thin layers 15b of substantially i-type hydrogenated a-Si (hereinafter referred to as a-Si:H). The layers 15a and 15b have the respective lowest energy levels $E_{ca}$ and $E_{cb}$ of their conduction bands and the respective highest energy levels $E_{va}$ and $E_{vb}$ of their valence bands. Accordingly, in the periodically multilayered film, a relatively larger energy band gap $E_{opta}=E_{ca}-E_{va}$ and a relatively smaller band gap $E_{optb}=E_{cb}-E_{vb}$ form a periodical band gap profile, namely, a multiplicity of quantum wells.

A method for fabricating the periodically multilayered film composed of p-type a-SiC:H layers and substantially i-type a-Si:H layers by using the photo CVD device shown in FIG. 2 will be hereinafter described. Silane gases such as SiH$_4$, Si$_2$H$_6$ and Si$_3$H$_8$ may be used as a gas including Si; gases such as C$_2$H$_2$, SiH$_n$(CH$_3$)$_{4-n}$ (n= 1, 2, 3 or 4) may be used as a gas including C; and gases such as B$_2$H$_6$ and B(CH$_3$)$_3$ may be used as a gas including B which is a p-type impurity. In this embodiment, gas cylinders 7a, 7b and 7c contain Si$_2$H$_6$, C$_2$H$_2$ and B$_2$H$_6$, respectively.

The substrate 4 is introduced from the preparatory chamber 13 into the first reaction chamber 1a through the opened separation shutter 12a and positioned opposite to the light source 3a. Then, after the separation shutter 12a is closed, the first reaction chamber 1a is evacuated to about 10$^{-5}$–10$^{-6}$ Torr by a rotary pump and a turbo molecular pump (not shown). Then, a mixed gas of Si$_2$H$_6$+C$_2$H$_2$+B$_2$H$_6$ selected by the gas selector 10 is introduced to form a p-type a-SiC:H thin layer 15a of about 50 Å thickness. The mixed gas is supplied at a rate of 10–100 cc per minute through the mercury reservoir which is held at 50° C. The flow rate and composition of the mixed gas is controlled by a mass flow controller connected to each of the gas cylinders. The pressure of the mixed gas introduced in the first reaction chamber 1a is 0.1–10 Torr. The substrate 4 is held at about 200°–300° C. by a heater. Then, the mixed gas is irradiated for 45 seconds by ultraviolet light at the rate of 50 mW/cm$^2$ which is a resonance radiation having the wavelengths of 1849 Å and 2537 Å, from the low pressure mercury lamp 3a, whereby a p-type a-SiC:H layer 15a of about 50 Å thickness is obtained. Then, the supply of the source gas is stopped and the first reaction chamber 1a is again evacuated to about 10$^{-5}$–10$^{-6}$ Torr.

After the evacuation, the substrate 4 is moved through the opened separation shutter 12ab into the second reaction chamber 1b which is evacuated beforehand to about 10$^{-5}$ to 10$^{-6}$ Torr. After the separation shutter 12ab is closed, Si$_2$H$_6$ gas is introduced into the second reaction chamber 1b. Then, the gas is irradiated for about 30 seconds by ultraviolet light at the rate of 50 mW/cm$^2$ and having the wavelengths of 1849 Å and 2537 Å wavelengths from the low pressure mercury lamp 3b, whereby an i-type a-Si:H layer 15b of about 50 Å thickness is obtained.

By moving back the substrate 4 to the evacuated first reaction chamber 1a after the evacuation of the second reaction chamber 1b and repeating the above described process, a periodically multilayered film is formed, which has p-type a-SiC:H layers 15a and i-type a-Si:H layers 15b periodically stacked for operating as a superlattice device.

Such a periodically multilayered film can also be formed by using the photo CVD device having a single reaction chamber shown in FIG. 1. However, fabrication of such a periodically multilayered film in a single reaction chamber requires a certain and perfect exchange of different source gases. Therefore, after the formation of a p-type a-SiC:H layer, evacuation must be carried out for a long period of time enough to completely remove Si$_2$H$_6$+C$_2$H$_2$+B$_2$H$_6$ gas from the reaction chamber.

Each of the gases Si$_2$H$_6$, C$_2$H$_2$ and B$_2$H$_6$ can be decomposed by the ultraviolet light without mercury sensitizing, so that it may be directly introduced into the reaction chamber bypassing the mercury reservoir. However, without mercury sensitizing, it requires about two minutes to grow an a-SiC:H layer 15a of about 50 Å thickness and it requires about one minute to one minute and 30 seconds to grow an a-Si:H layer 15b of about 50 Å thickness.

In order to confirm whether the periodically multilayered film obtained by the photo CVD device of FIG. 2 is forming a superlattice device or not, the band gap $E_{opt}$ is determined by a Tauc plot, and a value of 1.86 eV is obtained. On the other hand, an alloyed mono-layered semiconductor film which has an average composition of the periodically multilayered film shows a band gap $E_{opt}=1.82$ eV. Therefore, it is confirmed that the periodically multilayered film prepared by the photo CVD device of FIG. 2 forms a superlattice device having the quantum well effect.

Figure 4:
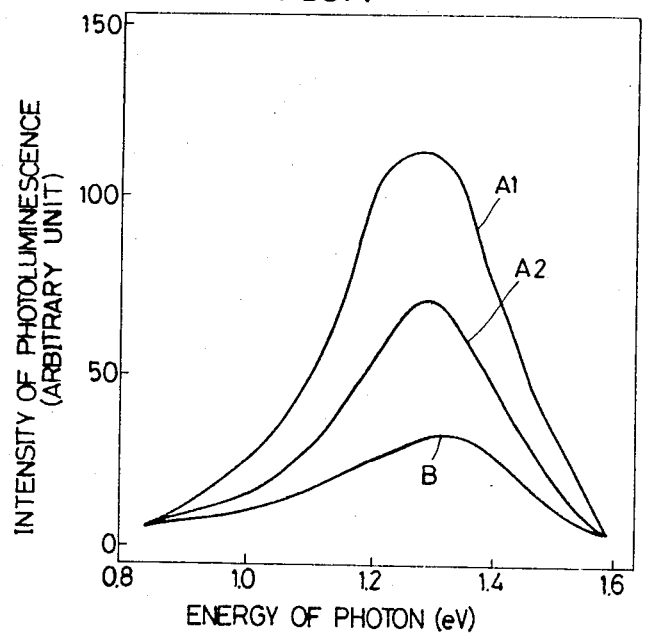
FIG. 4 shows graphs of the photoluminescence intensity of periodically multilayered films produced according to the invention and according to the prior art for comparing.

FIG. 4 shows the intensity of photoluminescence in the periodically multilayered film obtained by the photo CVD device of FIG. 2 according to the present invention (curve $A_1$) and the periodically multilayered film obtained by a conventional plasma CVD method (curve B). The intensity of photoluminescence lowers due to the non-radiative recombination caused by defects generated by plasma. Namely, the higher the intensity of the photoluminescence is, the higher electrical quality the film has. Even if a multilayered film having definite periodicity is formed by a plasma CVD method, the electrical quality of the film is not good because the intensity of photoluminescence is relatively much lower due to the non-radiative recombination caused by plasma damage. On the other hand, the periodically multilayered film obtained by photo CVD according to the present invention has a much higher photoluminescence intensity and, therefore, substantially fewer defects in the film.

Figure 5:
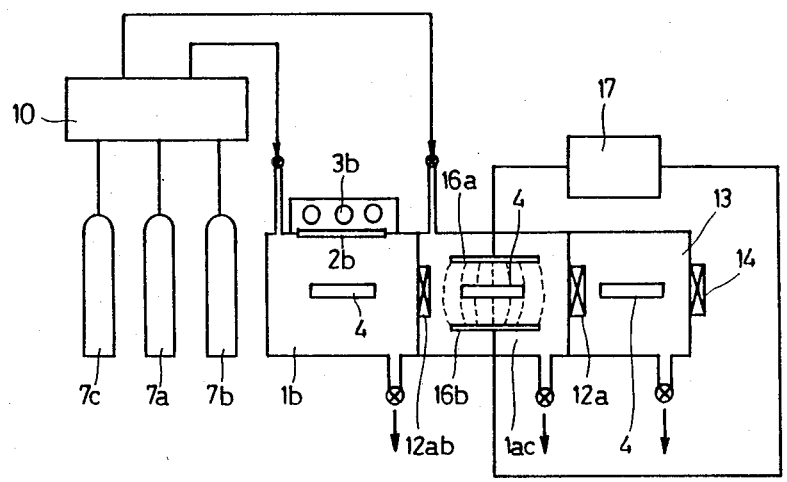
FIG. 5 is a conceptional view of still another CVD device used for performing the method according to the present invention.

FIG. 5 is a conceptional view of a CVD device for illustrating a further embodiment of the present invention. In this CVD device, the first photo CVD chamber 1a of FIG. 2 is replaced by a plasma CVD chamber 1ac. In the first reaction chamber 1ac, a radio frequency power of, for example, 13.56 MHz is applied between counter electrodes 16a and 16b from a high frequency power source 17. The glow discharge generated between these electrodes causes plasma CVD of the source gas.

The amorphous thin layers 15a obtained in the plasma CVD chamber 1ac include defects due to the plasma damage. However, the amorphous thin layers 15b are formed in the second reaction chamber 1b by photo CVD, so that the resulting periodically multilayered film contains less defects than the film having amorphous thin layers 15a and 15b both formed by plasma CVD. In fabricating one of the alternative amorphous thin layers by plasma CVD and the other by photo CVD, it is preferable that not the amorphous thin layer having a larger band gap, but the layer having a smaller band gap is formed by photo CVD, because the layer having the smaller band gap exerts more influence on the electric characteristics in the periodically multilayered film.

The intensity of photoluminescence of the periodically multilayered film having p-type a-SiC:H amorphous thin layers 15a of about 50 Å thickness each formed by plasma CVD and i-type a-Si:H amorphous thin layers 15b of about 50 Å thickness each formed by photo CVD is indicated by a curve $A_2$ in FIG. 4. As is apparent from FIG. 4, the periodically multilayered film according to this embodiment has improved electric characteristics compared to the conventional periodically multilayered film (curve B) with all layers formed by plasma CVD.

Although the amorphous thin layers 15a are formed by plasma CVD in this embodiment, they may be formed by thermal CVD or sputtering.

Figure 6:
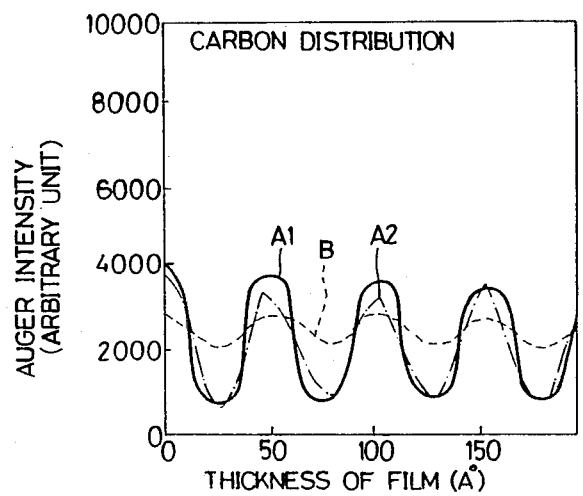
FIG. 6 is a graph showing the carbon distribution in periodically multilayered films.

FIG. 6 shows carbon distribution determined by Auger electron spectroscopy in periodically multilayered films composed of a-Si:H layers and a-SiC:H layers of 25 Å thickness each. A curve $A_1$ represents the carbon distribution in the film obtained by the photo CVD device of FIG. 2, showing a rectangular-wavelike distribution of 50 Å wavelength periodicity corresponding to the periodicity of the a-Si:H layers and a-SiC:H layers. More specifically, there is no interdiffusion between a-Si:H layers and a-SiC:H layers, and a good and definite periodicity is obtained. A curve $A_2$ shows carbon distribution in the periodically multilayered film obtained by the CVD device of FIG. 5. This multilayered film shows triangular-wavelike periodicity of 50 Å wavelength. This means that carbon is partially mixed in a-Si:H layers due to the interdiffusion or plasma damage. A curve B represents carbon distribution in the periodically multilayered film having a-SiC:H layers and a-Si:H layers both formed by plasma CVD. This curve shows a shallow sinusoidal wave. This means that much carbon is mixed into the a-Si:H layers from the a-SiC:H layers.

As is apparent from FIG. 6, the periodically multilayered film according to the present invention which has at least one kind of constituent layers formed by the photo CVD method, provides a more definite periodicity of composition than the conventional periodically multilayered film with all layers formed by plasma CVD.

Figure 7:
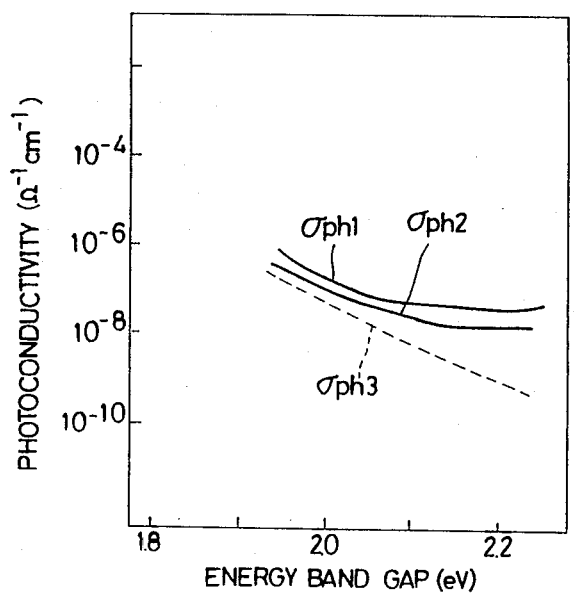
FIG. 7 is a graph showing the relation between the band gap and the photoconductivity in periodically multilayered films fabricated according to the present invention.

FIG. 7 is a graph showing the relation between band gap $E_{opt}$ and photoconductivity $\sigma_{ph}$ in the periodically multilayered film according to the present invention and of a conventional mono-layered film. A curve $\sigma_{ph1}$ shows the photoconductivity in a periodically multilayered film having p-type a-Si:H layers and i-type a-SiC:H layers formed by the photo CVD device of FIG. 2 while a curve $\sigma_{ph2}$ shows the photoconductivity of a periodically multilayered film composed of i-type a-Si:H layers and p-type a-SiC:H layers. A curve $\sigma_{ph3}$ shows the photoconductivity in a film of a single a-SiC:H layer formed by plasma CVD which has average composition of the periodically multilayered film. As is apparent from this figure, the periodically multilayered film according to the present invention has a high photoconductivity in spite of a large band gap.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for fabricating a periodically multilayered film having a plurality of amorphous thin layers of different kinds stacked periodically to form a stack, comprising the step of assuring a more definite periodicity in the composition of said stack by forming at least one type of said layers in said stack by photo CVD, whereby defects in the stack are reduced.

2. The method of claim 1, wherein different types of said layers are formed in the respective reaction chambers.

3. The method of claim 2, wherein all types of said layers are formed by photo CVD.

4. The method of claim 2, wherein one type of said layers is formed by plasma CVD.

5. The method of claim 2, wherein one type of said layers is formed by thermal CVD.

6. The method of claim 1, wherein different types of said layers differ from one another in at least one band gap and conductivity type.

7. The method of claim 6, wherein said periodically multilayered film comprises substantially i-type hydrogenated amorphous silicon carbide layers and p-type hydrogenated amorphous silicon layers.

8. The method of claim 6, wherein said periodically multilayered film comprises substantially i-type hydrogenated amorphous silicon layers and p-type hydrogenated amorphous silicon carbide layers.

9. The method of claim 1, wherein said layers contain at least one of the elements of group IVa of the periodic table.

10. The method of claim 9, wherein said periodically multilayered film has an energy band gap which changes periodically in the direction of the thickness.

11. The method of claim 10, wherein one type of said layers having the larger band gap comprises at least one element selected from the group consisting of silicon, silicon carbide, silicon nitride, silicon oxide and carbon.

12. The method of claim 10, wherein the other type of layers having the smaller band gap comprises at least one element selected from the group consisting of silicon, silicon germanium, silicon tin and germanium.

* * * * *